US012676174B2

(12) United States Patent
Lee et al.

(10) Patent No.: US 12,676,174 B2
(45) Date of Patent: Jul. 7, 2026

(54) METHOD AND DEVICE FOR SETTING IO PARAMETERS FOR COMMUNICATION BETWEEN SYSTEM ON CHIP AND MEMORY

(71) Applicant: SEMIFIVE INC., Seongnam-si (KR)

(72) Inventors: Hyun Min Lee, Gwangju-si (KR); Yong Soo Kim, Hwaseong-si (KR); Seung Chul Kang, Seoul (KR)

(73) Assignee: SEMIFIVE INC., Seongnam-si (KR)

( * ) Notice: Subject to any disclaimer, the term of this patent is extended or adjusted under 35 U.S.C. 154(b) by 141 days.

(21) Appl. No.: 18/909,444

(22) Filed: Oct. 8, 2024

(65) Prior Publication Data

US 2025/0104756 A1 Mar. 27, 2025

Related U.S. Application Data

(63) Continuation of application No. PCT/KR2022/016769, filed on Oct. 29, 2022.

(30) Foreign Application Priority Data

Apr. 8, 2022 (KR) ........................ 10-2022-0044033

(51) Int. Cl.
*G11C 11/4076* (2006.01)
*G11C 11/406* (2006.01)
(52) U.S. Cl.
CPC ........ *G11C 11/406* (2013.01); *G11C 11/4076* (2013.01)
(58) Field of Classification Search
CPC .......................... G11C 44/406; G11C 11/4076
See application file for complete search history.

(56) References Cited

U.S. PATENT DOCUMENTS

| 10,115,480 | B1 * | 10/2018 | Gamini | ............... G11C 11/4076 |
| 11,538,519 | B2 * | 12/2022 | Tissafi Drissi | ....... G11C 29/028 |
| 2004/0123207 | A1 * | 6/2004 | Zumkehr | ............. G11C 7/1066 |
| | | | | 714/744 |

FOREIGN PATENT DOCUMENTS

| KR | 10-2008-0046973 A | 5/2008 |
| KR | 10-2019-0029056 A | 3/2019 |

(Continued)

*Primary Examiner* — Min Huang
(74) *Attorney, Agent, or Firm* — Bridgeway IP Law Group, PLLC; Sang Ho Lee; Hyun Woo Shin

(57) ABSTRACT

The present disclosure relates to a method and apparatus enabling setting of I/O parameters for communication between a system-on-chip and a memory. The method according to the present disclosure includes: a process of setting an initial combination of IO parameter values that can be accessed from the system-on-chip to the memory through signal lines including a command/address signal line and a data signal line; a process of detecting IO parameter values that can access the memory and have a largest margin as IO parameter values for the command/ address signal line while changing only IO parameter values for the command/address signal line in the initial combination of IO parameter values; a process of detecting IO parameter values that can access the memory and have a largest margin as IO parameter values for the data signal line in operation of writing while changing only IO parameter values for the data signal line in the operation of writing data in the initial combination of IO parameter values; a process of detecting IO parameter values that can access the memory and have a largest margin as IO parameter values for the data signal line in operation of reading while changing only IO parameter values for the data signal line in the operation of reading data in the initial combination of IO parameter values; and a process of creating a final combination of IO parameter values using the IO parameter values for the (Continued)

command/address signal line, the IO parameter values for the data signal line in the operation of writing, and the IO parameter values for the data signal line in the operation of reading.

10 Claims, 7 Drawing Sheets

(56) References Cited

FOREIGN PATENT DOCUMENTS

| KR | 10-2019-0066500 A | 6/2019 |
| KR | 10-2021-0116604 A | 9/2021 |
| KR | 10-2022-0031793 A | 3/2022 |

* cited by examiner

METHOD AND DEVICE FOR SETTING IO PARAMETERS FOR COMMUNICATION BETWEEN SYSTEM ON CHIP AND MEMORY

CROSS-REFERENCE TO RELATED APPLICATION

The present application is a continuation application of International Patent Application No. PCT/KR2022/016769 filed Oct. 29, 2022, and claims priority under 35 U.S.C. § 365 and/or 35 U.S.C. § 119 (a) to Korean Patent Application No. 10-2022-0044033 filed Apr. 8, 2022, the entire contents of which are incorporated herein by reference.

BACKGROUND OF THE INVENTION

1. Field of the Invention

The present disclosure relates to a method and apparatus enabling automatic setting of I/O parameters for communication between a system-on-chip and a memory.

2. Description of the Related Art

A system-on-chip (SoC) is obtained by making a system composed of devices having multiple functions into a single chip. For example, principal semiconductor devices, such as a computing device (CPU), a memory device, and a digital signal processing device, are implemented into a single chip such that the chip itself becomes a single system.

The embedded board that is used in embedded systems is composed of a system-on-chip, a memory, peripheral devices, an expansion connector, etc. When power is applied to such an embedded board, the system-on-chip loads a program onto the memory and takes and executes commands of the program one by one from the memory. Memories are used to store program commands, data, or the like, and a Dynamic Random Access Memory (DRAM) that is cheap and has high performance is generally used. Since various peripheral devices, a connector, etc. are on an embedded board, a system-on-chip can use necessary functions in accordance with the purposes of use.

However, for smooth communication between a system-on-chip and a memory such as a DRAM, it is required to appropriately set IO parameters, which influence the quality of signals that are used for communication, such as driving strength, On-Die Termination (ODT), and reference voltage.

Such IO parameters are generally manually set on the basis of the experience of developers. However, the method of manually setting IO parameters requires a process in which developers perform a test while changing setting into combinations of various IO parameter values, so a considerable amount of work and work time is required. Further, it is difficult to know whether IO parameter values set through manual work are optimal IO parameter settings.

Accordingly, there is a need for a plan that makes it possible to automatically detect and set optimal IO parameter values even without manual work by developers.

SUMMARY OF THE INVENTION

Accordingly, an objective of the present disclosure is to provide a method and apparatus enabling automatic setting of I/O parameter values for communication between a system-on-chip and a memory.

In order to achieve the objectives, a method of setting IO parameters for communication between a system-on-chip and a memory according to the present disclosure includes: setting a combination of IO parameter values that can be accessed from the system-on-chip to the memory as an initial combination of IO parameter values through signal lines including a command/address signal line and a data signal line; detecting IO parameter values that can access the memory and have a largest margin as IO parameter values for the command/address signal line while changing only IO parameter values for the command/address signal line in the initial combination of IO parameter values; detecting IO parameter values that can access the memory and have a largest margin as IO parameter values for the data signal line in operation of writing while changing only IO parameter values for the data signal line in the operation of writing data in the initial combination of IO parameter values; detecting IO parameter values that can access the memory and have a largest margin as IO parameter values for the data signal line in operation of reading while changing only IO parameter values for the data signal line in the operation of reading data in the initial combination of IO parameter values; and creating a final combination of IO parameter values using the IO parameter values for the command/address signal line, the IO parameter values for the data signal line in the operation of writing, and the IO parameter values for the data signal line in the operation of reading.

Further, the method may further include setting IO parameters for a signal line connecting the system-on-chip and the memory using the final combination of IO parameter values.

A process of detecting IO parameter values with the largest margin in the command/address signal line may perform detection while changing a generation position of a strobe signal that is used to recognize a command/address signal, and a process of detecting IO parameter values with the largest margin in the data signal line may perform detection while changing a generation position of a strobe signal that is used to recognize a data signal.

Further, in order to achieve the objectives, the present disclosure may provide a recording medium that can be read by a processor on which a program for performing the method on a processor is recorded.

Further, in order to achieve the objectives, an apparatus according to the present disclosure includes: a system-on-chip; a memory that is connected with the system-on-chip memory through signal lines including a command/address signal line and a data signal line; a parameter detector that detects IO parameter values which can access the memory and have a largest margin as IO parameter values for the command/address signal line while changing only IO parameter values for the command/address signal line in an initial combination of IO parameter values which is a combination of IO parameter values which can be accessed from the system-on-chip to the memory, that detects IO parameter values which can access the memory and have a largest margin as IO parameter values for the data signal line in operation of writing while changing only IO parameter values for the data signal line in the operation of writing data in the initial combination of IO parameter values, and that detects IO parameter values which can access the memory and have a largest margin as IO parameter values for the data signal line in operation of reading while changing only IO parameter values for the data signal line in the operation of reading data in the initial combination of IO parameter values; and a controller that sets the initial combination of IO parameters and creates a final combination of IO parameter values using the IO parameter values for the command/ address signal line, the IO parameter values for the data signal line in the operation of writing, and the IO parameter values for the data signal line in the operation of reading.

DETAILED DESCRIPTION OF THE
PREFERRED EMBODIMENTS

In this specification, It should be understood that, when it is described that a component is "connected to" or "accesses" another component, the component may be directly connected to or access the other component or a third component may be present therebetween. Other expressions describing the relationship of the components, that is, expressions such as "between" and "directly between" or "adjacent to" and any component "transmits" a signal to another component should also be similarly interpreted.

The present disclosure is described hereafter in more detail with reference to the accompanying drawings.

Figure 1:
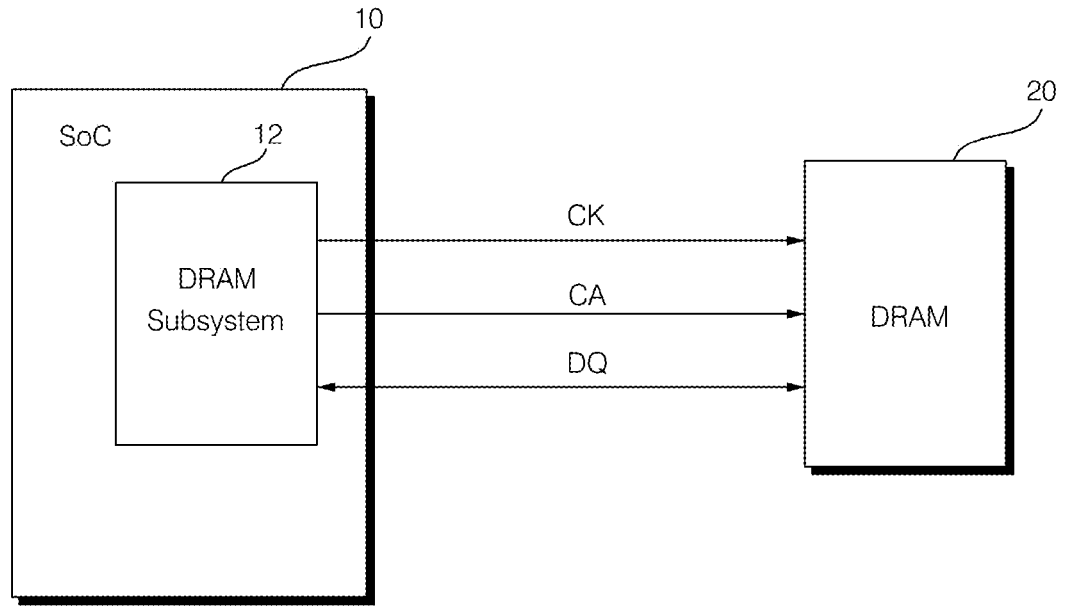
FIG. 1 is a diagram that is referred to for describing communication between a system-on-chip and a memory.

FIG. 1 is a diagram that is referred to for describing communication between a system-on-chip and a memory.

Referring to FIG. 1, a system-on-chip (SoC) 10 is connected to a memory 20 through multiple signal lines. The system-on-chip 10 is equipped with a memory subsystem 12 dedicated to controlling the memory 20 and communicates with the memory 12 through the memory subsystem 12, thereby being able to store data into the memory 20 or take out data stored in the memory 20.

Multiple signal lines may be used for communication between the system-on-chip 10 and the memory 20. For example, in the case of Synchronous Dynamic Random Access Memory (SDRAM), a clock (CK) signal line is used for a clock signal for synchronization and a command/ address (CA) signal line is used to transmit commands or addresses to be read and written from the system-on-chip 10 to the memory 20. Further, a data (DQ) signal line is used to transmit or receive data. In addition, additional signal lines are used, depending on the kind, operation, or the like of the memory.

Meanwhile, as the computing speed of the system-on-chip 10 increases, the speed of the memory 20 also increases and the entire computing performance is improved. However, high-quality signals should be maintained on the signal lines connecting the system-on-chip 10 and the memory 20 so that the system-on-chip 10 and the memory 20 perform smooth communication at a high speed. To this end, it is required to appropriately set IO parameters, which are factors influencing a signal quality, such as drive strength, On-Die Termination (ODT), and reference voltage (Voltage REFerence (VREF)).

FIGS. 2 to 5 are diagrams that are referred to for describing IO parameters that influence a signal quality.

Figure 2:
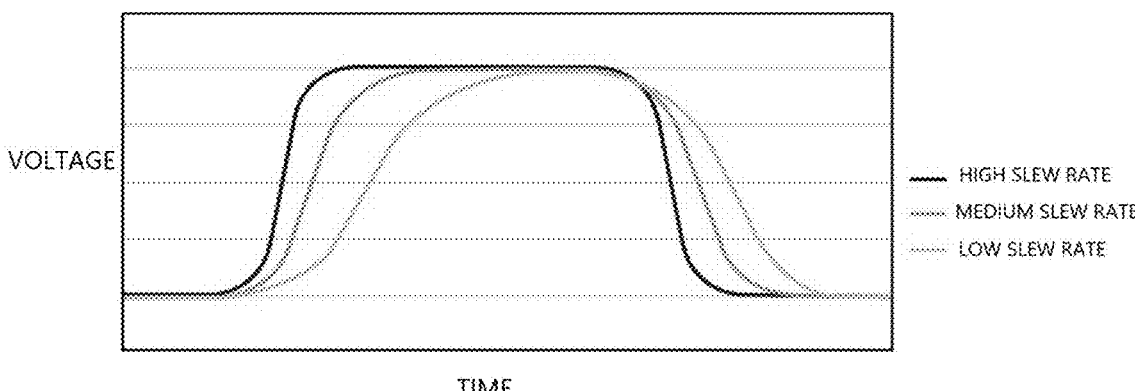
FIGS. 2 to 5 are diagrams that are referred to for describing IO parameters that influence a signal quality.

Referring to FIG. 2, drive strength shows the intensity of a signal when data is transmitted. When the intensity of a signal increases, a slew rate increases, so a target voltage is quickly reached, which is advantageous in high-speed communication.

Figure 3:
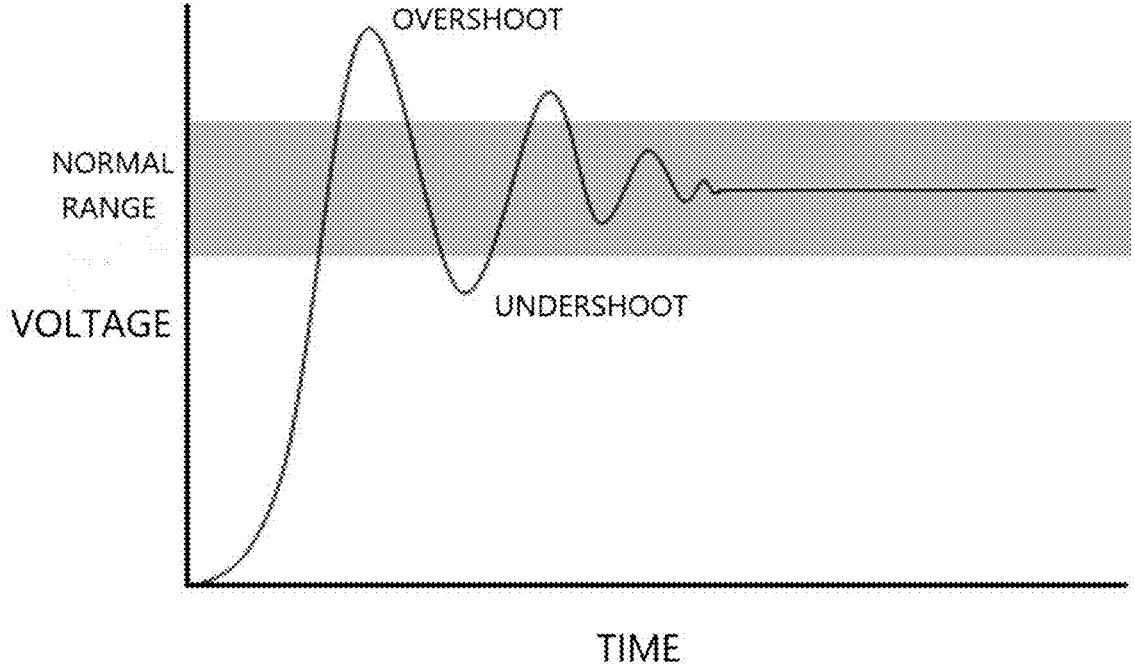

However, high drive strength is not always advantageous. That is, when a signal is excessively strong, as shown in FIG. 3, overshoot that goes over a target point may be generated, it generates continuous undershoot and waving of a signal is generated, so it influences the stability of a signal. Accordingly, it is required to set appropriate drive strength in order to increase signal quality.

Figure 4:
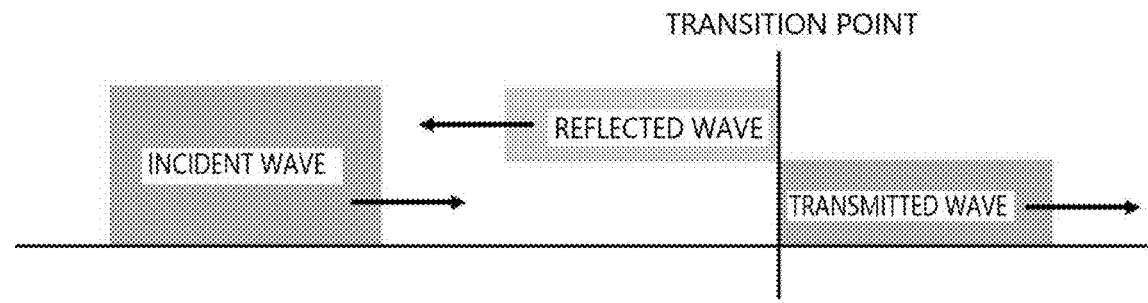

Referring to FIG. 4, On-Die Termination (ODT) is a technique that reduces a reflected wave by matching impedance through a terminating resistor at the end of a signal line. When impedance is not fit between the system-on-chip 10 and the memory 20, a reflected wave is generated in a signal, whereby the magnitude of the signal that is substantially transmitted is decreased or distorted, which interferes with stable communication. Impedance should be matched by adjusting an ODT resistance value to minimize a reflected wave.

Further, the reference voltage (VREF) is a voltage that is the reference for determining whether a received signal is 0 or 1. For example, when 100 mV is set as a reference voltage, a signal received at 100 mV or more is determined as 1 and a signal received at less than 100 mV is determined as 0.

Accordingly, it is possible to achieve high signal quality and perform smooth communication at a high speed by appropriately setting drive strength, ODT, reference voltage (VREF) in the signal lines connected between the system-on-chip 10 and the memory 20.

When data is written on the memory 20, the system-on-chip 10 transmits a command that says writing data and the location to write the data to the memory 20 through the address/command (CA) signal line and transmits the data is transmitted through the data (DQ) line. That is, since data is transmitted from the system-on-chip 10 to the memory 20, the system-on-chip 10 generates a signal and the memory 20 receives the signal. Since the drive strength determines the magnitude of a signal when the signal is generated, a drive strength setting value at the system-on-chip 10 is used when data is written on the memory 20. The ODT uses the value at the memory 20 that is the part receiving a signal through a terminating resistor reducing a reflected wave, and the reference voltage (VREF) also uses the value at the memory 20 because it is the reference for determining whether a received signal is 0 or 1.

When data is read from the memory 20, data is transmitted from the memory 20 to the system-on-chip 10, so the memory 20 generates a signal and the system-on-chip 10 receives the signal. Accordingly, data is read, the drive strength at the memory 20 is used, and the ODT and the reference voltage (VREF) at the system-on-chip 10 that is the part receiving the data are used.

Since commands are always transmitted from the system-on-chip 10 to the memory 20, a command/address (CA) signal uses always the drive strength at the system-on-chip 10, and the ODT and the reference voltage (VREF) at the memory 20 are used.

As described above, the IO parameters that are involved in reading data from the memory 20 or writing data on the memory 20 are different, and signal characteristics greatly change, depending on the combinations of the IO parameters. A good combination of IO parameters provides little noise and a large margin, so the memory 20 can be stably driven at a high speed, but a poor combination does not satisfy the requirements for driving the memory 20, so data cannot be read and written. Accordingly, it is very important in communication between the system-on-chip 10 and the memory 20 to find out optimal IO parameter values. The Settable value according to each IO parameter depends on the kinds, the manufacturer, etc. of the system-on-chip 10 and the memory 20, but an example from an LPDDR4 (Low Power Double Data Rate 4) that is low-power consumption memory is as follows.

a worker who sets and checks IO parameter values, the work speed is also low, and it is difficult to check all combinations of parameter values, so it is not sure whether found IO parameter values are optimal values.

Further, if the memory 20 is initialized with one combination of IO parameter values and it is sure that reading and writing are normal, it is possible to know that the combination of IO parameter values is effective, but if operation is successful once, it does not mean stable operation. Accordingly, it is required to determine stability of a combination of IO parameter values through reading and writing tests for several times and several days. Further, the fact that a

TABLE 1

| Line | Device | IO parameters | Settable values |
|---|---|---|---|
| CA | SoC | Drive Strength | 240Ω, 120Ω, 80Ω, 60Ω, 48Ω, 40Ω, 34Ω, 30Ω |
| CA | Memory | ODT | OFF, 240Ω, 120Ω, 80Ω, 60Ω, 48Ω, 40Ω |
| CA | Memory | VREF | 15.0%, 15.6%, 16.2%, 16.8%, 17.4%, 18.0%, 18.6%, 19.2%, 19.8%, 20.4%, 21.0%, 21.6%, 22.2%, 22.8%, 23.4%, 24.0%, 24.6%, 25.1%, 25.7%, 26.3%, 26.9%, 27.5%, 28.1%, 28.7%, 29.3%, 29.9%, 30.5%, 31.1%, 31.7%, 32.3%, 32.9%, 33.5%, 34.1%, 34.7%, 35.3%, 35.9%, 36.5%, 37.1%, 37.7%, 38.3%, 38.9%, 39.5%, 40.1%, 40.7%, 41.3%, 41.9%, 42.5%, 43.1%, 43.7%, 44.3%, 44.9%, 45.5%, 46.1%, 46.7%, 47.3%, 47.9%, 48.5%, 49.1%, 49.7%, 50.3%, 50.9%, 51.5%, 52.1%, 52.7%, 53.3%, 53.9%, 54.5%, 55.1%, 55.7%, 56.3%, 56.9%, 57.5%, 58.1%, 58.7%, 59.3%, 59.9%, 60.5%, 61.1%, 61.7%, 62.3%, 62.9% |
| DQ | SoC | Drive Strength | 240Ω, 120Ω, 80Ω, 60Ω, 48Ω, 40Ω, 34Ω, 30Ω |
| DQ | SoC | ODT | OFF, 240Ω, 120Ω, 80Ω, 60Ω, 48Ω, 40Ω |
| DQ | SoC | VREF | 16.82%, 17.64%, 18.47%, 19.29%, 20.12%, 20.95%, 21.77%, 22.60%, 23.42%, 24.25%, 25.31%, 26.14%, 26.96%, 27.79%, 28.62%, 29.44%, 30.27%, 31.10%, 31.92%, 32.75%, 33.58%, 34.43%, 35.26%, 36.09%, 36.91%, 37.74%, 38.56%, 39.39%, 40.22%, 41.04%, 42.09%, 42.92%, 43.75%, 44.57%, 45.40%, 46.23%, 47.05%, 47.88%, 48.70%, 49.53%, 50.49%, 51.35%, 52.18%, 53.00%, 53.83%, 54.66%, 55.48%, 56.31%, 57.13%, 57.96%, 58.79%, 59.61%, 60.76%, 61.58%, 62.41%, 63.23%, 64.06%, 64.88%, 65.70%, 66.52%, 67.35%, 68.14%, 68.93%, 69.73% |
| DQ | Memory | Drive Strength | 240Ω, 120Ω, 80Ω, 60Ω, 48Ω, 40Ω |
| DQ | Memory | ODT | OFF, 240Ω, 120Ω, 80Ω, 60Ω, 48Ω, 40Ω |
| DQ | Memory | VREF | 15.0%, 15.6%, 16.2%, 16.8%, 17.4%, 18.0%, 18.6%, 19.2%, 19.8%, 20.4%, 21.0%, 21.6%, 22.2%, 22.8%, 23.4%, 24.0%, 24.6%, 25.1%, 25.7%, 26.3%, 26.9%, 27.5%, 28.1%, 28.7%, 29.3%, 29.9%, 30.5%, 31.1%, 31.7%, 32.3%, 32.9%, 33.5%, 34.1%, 34.7%, 35.3%, 35.9%, 36.5%, 37.1%, 37.7%, 38.3%, 38.9%, 39.5%, 40.1%, 40.7%, 41.3%, 41.9%, 42.5%, 43.1%, 43.7%, 44.3%, 44.9%, 45.5%, 46.1%, 46.7%, 47.3%, 47.9%, 48.5%, 49.1%, 49.7%, 50.3%, 50.9%, 51.5%, 52.1%, 52.7%, 53.3%, 53.9%, 54.5%, 55.1%, 55.7%, 56.3%, 56.9%, 57.5%, 58.1%, 58.7%, 59.3%, 59.9%, 60.5%, 61.1%, 61.7%, 62.3%, 62.9% |

As shown in Table 1, since there are various settable values for each IO parameters, it is not easy to find out optimal IO parameter values. Further, since signal quality is not determined by one IO parameter value and is determined on the basis of a combination of IO parameter values, when there are many settable IO parameter values, the number of combinations of IO parameter values increases in geometric progression. Assuming that all of combinations of all of IO parameters are checked one by one, the number of the combinations is 60 billion, which is uncountable quantity.

Accordingly, a method that finds out appropriate IO parameter values by reducing the number of combinations by excluding values in a predetermined range using numerical values obtained through experiences and by manually checking and changing setting values one by one is used in the related art. According to this method, there is a need for combination of IO parameters is effective means that a memory is operated with the combination of IO parameters, and does not mean an optimal combination. Currently, if operation is stable, a signal may be influenced by various factors such as temperature, humidity, peripheral devices, etc., so it is important to find out an optimal combination that is strong against even a certain degree of influence.

Figure 5:
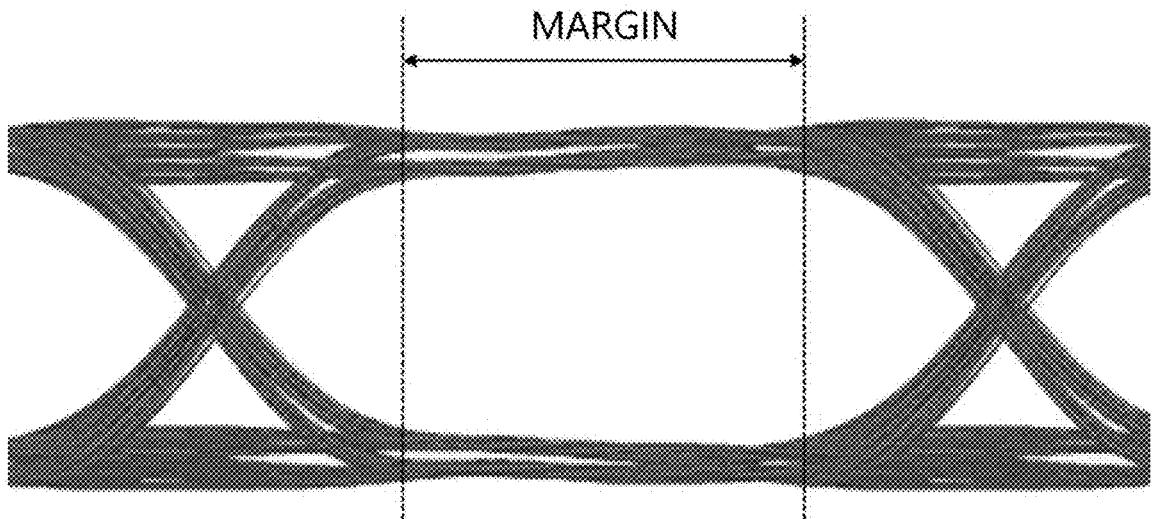

As shown in FIG. 5, there is a period that is maintained until one data signal starts, reaches a target voltage, and is then converted into a next data signal, and the width of the part is called a margin. When not having a minimum margin magnitude proposed by the standard of a memory that is used, it is impossible to read and write.

If the margin of an IO parameter value is wide, there is room for the margin even though the quality of a signal is deteriorated by external factors, so stability is increased.

Accordingly, it is possible to estimate a combination composed of IO parameter values with the largest margin as a best combination, and a method of detecting and setting IO parameter values with the largest margin in this way is used in the present disclosure.

Figure 6:
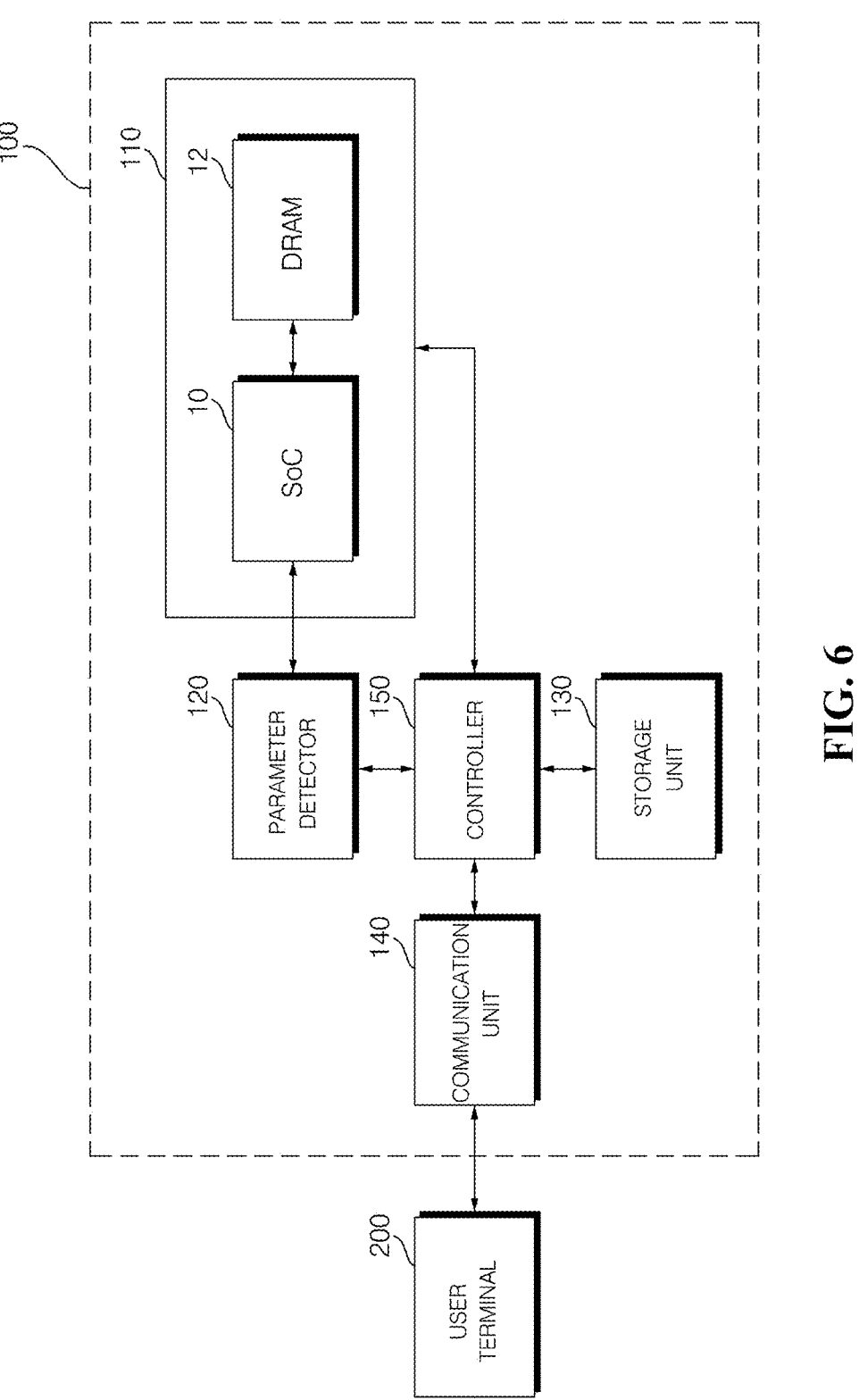
FIG. 6 is a diagram showing an example of an apparatus to which a method for setting IO parameters according to an embodiment of the present disclosure is applied.

FIG. 6 is a diagram showing an example of an apparatus to which a method of setting IO parameters according to an embodiment of the present disclosure is applied.

Referring to FIG. 6, the apparatus 100 may include a device mounting unit 110, a parameter detector 120, a storage unit 130, a communication unit 140, and a controller 150. When these components are implemented substantially in applications, two or more of the components may be combined into one component or one component may be divided into two or more components.

The system-on-chip 10 and the memory 20 that are target devices for detecting IO parameter values are installed on the device mounting unit 110.

The parameter detector 120 detects optimal parameter values to be applied to the system-on-chip 10 and the memory 20 using settable IO parameter values stored in the storage unit 130.

All of IO parameter values that can be set in the system-on-chip 10 and the memory 20 are stored in the storage unit 130, and other programs, data, etc. for operation control are also stored therein.

The communication unit 140 provides a communication interface for communication with a user terminal 200 such as a PC.

The controller 150 controls general operation of the apparatus 100 by controlling the operation of the components so that optimal IO parameter values can be detected and set. Information about a combination of the detected optimal IO parameters is transmitted to the user terminal 200, etc. through the communication unit 140, so the information can be used to set other devices.

Figure 7:
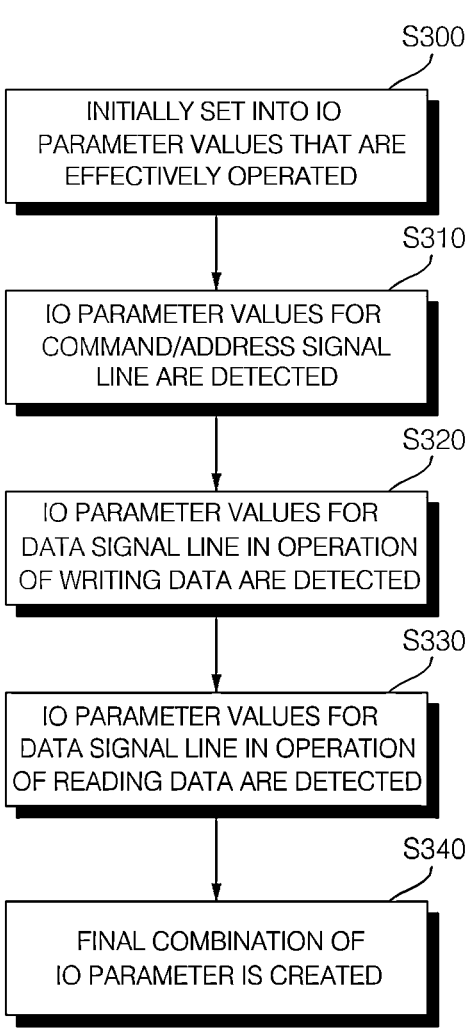
FIG. 7 is a flowchart provided to describe the method for setting IO parameters according to an embodiment of the present disclosure.

FIG. 7 is a flowchart provided to describe the method of setting IO parameters according to an embodiment of the present disclosure.

Referring to FIG. 7, first, the controller 150 sets a combination of IO parameters that are effectively operated as an initial combination of IO parameter values, and initially sets the system-on-chip 10 and the memory 20 on the basis of the initial combination of IO parameter values (S300). The combination of IO parameters that are effectively operated means a combination of IO parameters that enable the system-on-chip 10 to normally read and write data on and from the memory 20, that is, that can be accessed from the system-on-chip 10 to the memory 20 through signal line connected between the system-on-chip 10 and the memory 20. The combination of IO parameters that are effectively operated may be applied by searching for IO parameter values enabling the system-on-chip 10 to access the memory 20 while sequentially applying settable IO parameter values.

After initial setting, the parameter detector 120 detects IO parameter values for the command/address (CA) signal line (S310). The signal quality of the data (DQ) signal line is not influenced even though the IO parameter values for the command/address (CA) signal line are changed, it is possible to detect IO parameter values that are effectively operated and have the largest margin as IO parameter values for the command/address (CA) signal line while sequentially selecting and changing only the IO parameter values for the command/address (CA) signal line in the initial combination of parameter values from the settable values stored in the storage unit 130.

Next, the parameter detector 120 detects IO parameter values for the data (DQ) signal line in operation of writing data (S320). It is possible to detect IO parameter values that are effectively operate and have the largest margin as IO parameter values for the data (DQ) signal line in operation of writing data while sequentially selecting and changing the IO parameter values for the data (DQ) signal line in the operation of writing data from the settable IO parameter values stored in the storage unit 130.

Similarly, the IO parameter values for the data (DQ) signal line that are applied when data is written never influence the IO parameter values for the data (DQ) signal line that are applied when data is read.

Next, the parameter detector 120 detects IO parameter values for the data (DQ) signal line in operation of reading data (S330). It is possible to detect IO parameter values that are effectively operate and have the largest margin as IO parameter values for the data (DQ) signal line in operation of reading data while sequentially selecting and changing the IO parameter values for the data (DQ) signal line in the operation of reading data from the settable IO parameter values stored in the storage unit 130.

The controller 150 creates a final combination of IO parameter values using the detected IO parameter values for the command/address (CA) signal line, IO parameter values for the data (DQ) signal line in operation of writing data, and IO parameter values for the data signal line in operation of reading data (S340). The created final combination of IO parameter values is used to set a device to be used.

In this way, it is possible to create a final combination of IO parameter values by independently detecting IO parameter values for the command/address (CA) signal line, IO parameter values for the data (DQ) signal line when data is written, and IO parameter values for the data (DQ) signal line when data is read. Accordingly, the number of combinations of IO parameters to be tested is greatly reduced, so it is possible to reduce the time for finding out an optimal combination. Further, it is possible to use an optimal combination of IO parameters by detecting and using IO parameters with the largest margin.

Figure 8:
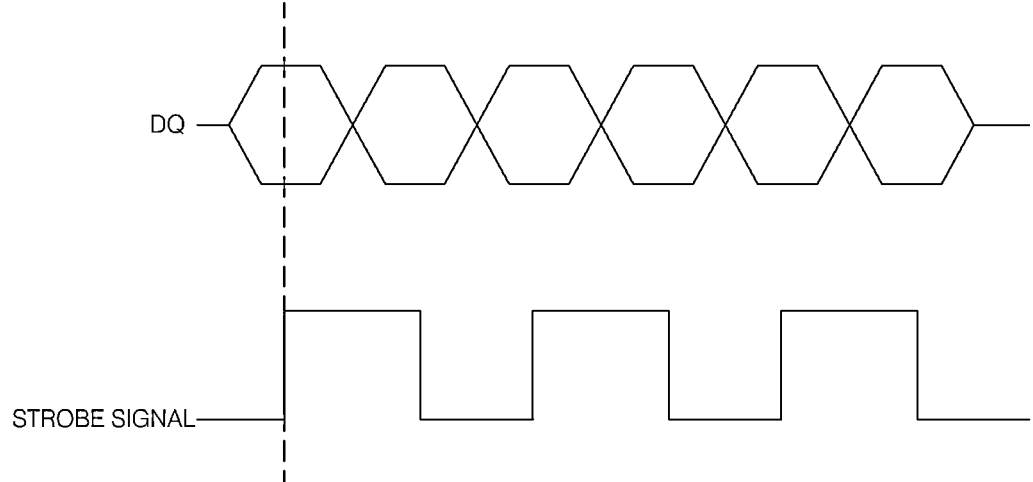
FIGS. 8 to 9B are diagrams that are referred to for describing the method for setting IO parameters according to an embodiment of the present disclosure.
Figure 9A:
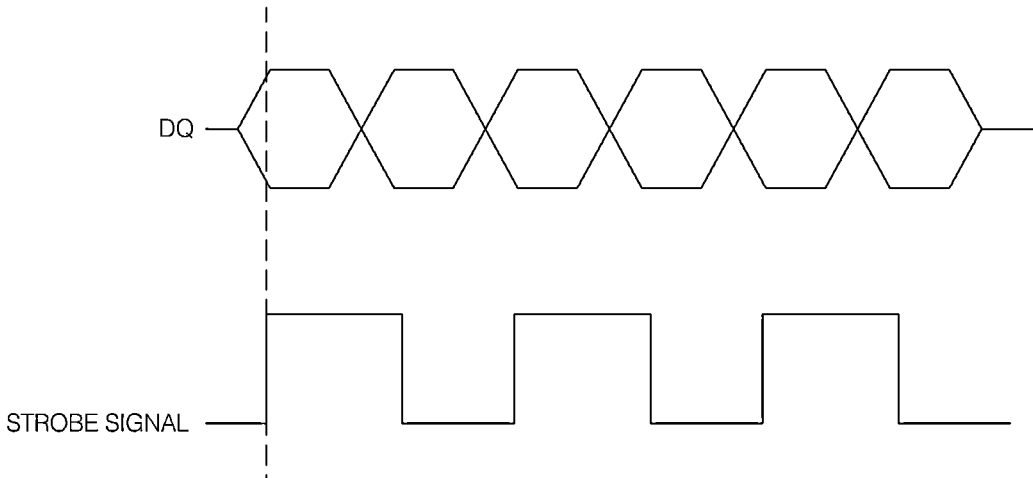
Figure 9B:
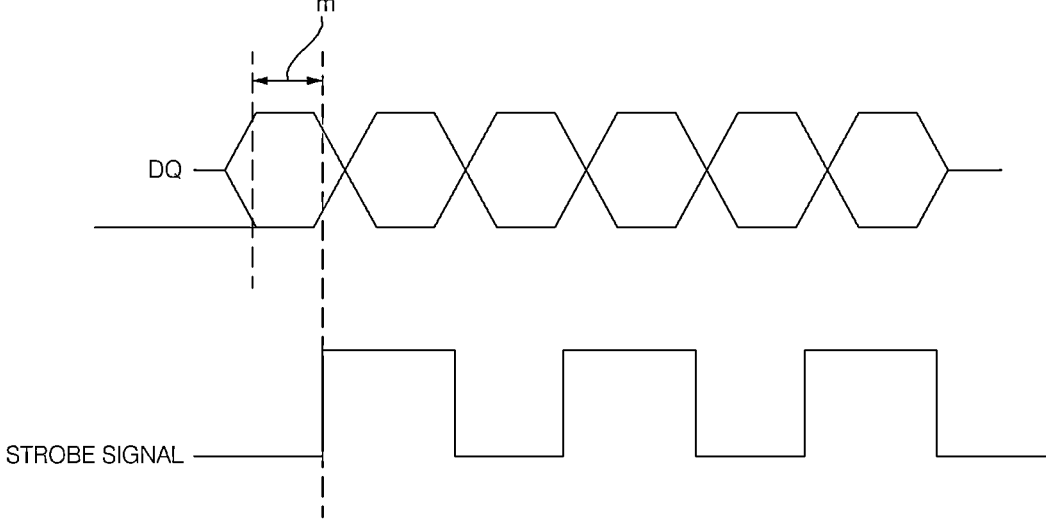

FIGS. 8 to 9B are diagrams that are referred to for describing the method for setting IO parameters according to the present disclosure.

Referring to FIG. 8, in the case of a data (DQ) signal, when data is transmitted, a strobe signal such as a Data Strobe (DQS) for notifying of when data should be read is also transmitted, and when the DQS signal is asserted, a data (DQ) signal is read and data is taken from the system-on-chip 10 or the memory 20.

A strobe signal is generated usually at the medium of a margin, and it is possible to advance or delay the point in time at which a strobe signal is generated through software. By using this, when a strobe signal is moved left until reading and writing end in failure, as shown in FIG. 9A, it is possible to know a leftmost position of the margin, and, as shown in FIG. 9B, when the strobe signal is moved right, it is possible to know the rightmost position of the margin. Accordingly, it is possible to find out the magnitude of a margin 'm' and detect an IO parameter with the largest margin.

In the case of a command/address (CA) signal, the value of a command/address (CA) signal line is read using a clock (CK) signal as a strobe signal without using a DQS, so it is possible to find out a margin in the same way by moving left and right a clock signal (CK) that is used as a strobe signal.

It is possible to detect an IO parameter value with the largest margin through this process.

Meanwhile, the method and apparatus for setting IO parameters according to the present disclosure are not limited to the configurations of the embodiments described above, some or all of the embodiments may be selectively combined so that the embodiments can be changed in various ways.

The present invention can be realized as code that can be read by a processor and that can be written on a computer-readable recording medium. The computer-readable recording medium may be any type of recording device in which data is stored in a computer-readable manner. Examples of the computer-readable recording medium include a ROM, a RAM, a CD-ROM, an optical data storage. The computer-readable recording medium can be distributed over a plurality of computer systems connected to a network so that computer-readable code is written thereto and executed therefrom in a decentralized manner.

As described above, according to the present disclosure, it is possible to automatically detect and set IO parameter values for communication between a system-on-chip and a memory. Accordingly, it is possible to detect and set optimal IO parameter values at a high work speed in comparison to manual work, so it is possible to minimize the amount of work of developers and reduce the time for development.

Further, although the exemplary embodiments of the present invention have been illustrated and described above, the present invention is not limited to the aforementioned specific embodiments, various modifications may be made by a person with ordinary skill in the technical field to which the present invention pertains without departing from the subject matters of the present invention that are claimed in the claims, and these modifications should not be appreciated individually from the technical spirit or prospect of the present invention.

What is claimed is:

1. A method of setting IO parameters for communication between a system-on-chip and a memory, the method comprising:

setting a combination of IO parameter values that can be accessed from the system-on-chip to the memory as an initial combination of IO parameter values through signal lines including a command/address signal line and a data signal line;

detecting IO parameter values that can access the memory and have a largest margin as IO parameter values for the command/address signal line while changing only IO parameter values for the command/address signal line in the initial combination of IO parameter values;

detecting IO parameter values that can access the memory and have a largest margin as IO parameter values for the data signal line in operation of writing while changing only IO parameter values for the data signal line in the operation of writing data in the initial combination of IO parameter values;

detecting IO parameter values that can access the memory and have a largest margin as IO parameter values for the data signal line in operation of reading while changing only IO parameter values for the data signal line in the operation of reading data in the initial combination of IO parameter values; and creating a final combination of IO parameter values using the IO parameter values for the command/address signal line, the IO parameter values for the data signal line in the operation of writing, and the IO parameter values for the data signal line in the operation of reading.

2. The method of claim 1, further comprising setting IO parameters for a signal line connecting the system-on-chip and the memory using the final combination of IO parameter values.

3. The method of claim 1, wherein a process of detecting IO parameter values with the largest margin in the command/address signal line performs detection while changing a generation position of a strobe signal that is used to recognize a command/address signal.

4. The method of claim 1, wherein a process of detecting IO parameter values with the largest margin in the data signal line performs detection while changing a generation position of a strobe signal that is used to recognize a data signal.

5. The method of claim 1, wherein the IO parameters include drive strength, ODT, and reference voltage.

6. A recording medium that can be read by a processor on which a program for performing the method of claim 1 on a processor is recorded.

7. An apparatus for setting parameters, comprising:

a system-on-chip;

a memory that is connected with the system-on-chip memory through signal lines including a command/address signal line and a data signal line;

a parameter detector that detects IO parameter values which can access the memory and have a largest margin as IO parameter values for the command/address signal line while changing only IO parameter values for the command/address signal line in an initial combination of IO parameter values which is a combination of IO parameter values which can be accessed from the system-on-chip to the memory, that detects IO parameter values which can access the memory and have a largest margin as IO parameter values for the data signal line in operation of writing while changing only IO parameter values for the data signal line in the operation of writing data in the initial combination of IO parameter values, and that detects IO parameter values which can access the memory and have a largest margin as IO parameter values for the data signal line in operation of reading while changing only IO parameter values for the data signal line in the operation of reading data in the initial combination of IO parameter values; and a controller that sets the initial combination of IO parameters and creates a final combination of IO parameter values using the IO parameter values for the command/address signal line, the IO parameter values for the data signal line in the operation of writing, and the IO parameter values for the data signal line in the operation of reading.

8. The apparatus of claim 7, wherein the controller sets IO parameters for a signal line connecting the system-on-chip and the memory using the final combination of IO parameter values.

9. The apparatus of claim 7, further comprising a communication unit that provides a communication interface for communication with an external device.

10. The apparatus of claim 7, further comprising a storage unit that stores IO parameter values that can be set in the system-on-chip and the memory.

* * * * *